United States Patent
Kudo et al.

(10) Patent No.: US 12,224,556 B2
(45) Date of Patent: Feb. 11, 2025

(54) LIGHT EMITTING DEVICE, PROJECTOR, AND DISPLAY

(71) Applicants: SEIKO EPSON CORPORATION, Tokyo (JP); SOPHIA SCHOOL CORPORATION, Tokyo (JP)

(72) Inventors: Manabu Kudo, Suwa (JP); Katsumi Kishino, Akiruno (JP)

(73) Assignees: SEIKO EPSON CORPORATION, Tokyo (JP); SOPHIA SCHOOL CORPORATION, Tokyo (JP)

( * ) Notice: Subject to any disclaimer, the term of this patent is extended or adjusted under 35 U.S.C. 154(b) by 523 days.

(21) Appl. No.: 17/693,394

(22) Filed: Mar. 13, 2022

(65) Prior Publication Data
US 2022/0294184 A1 Sep. 15, 2022

(30) Foreign Application Priority Data
Mar. 15, 2021 (JP) ................................. 2021-041217

(51) Int. Cl.
*H01S 5/11* (2021.01)
*G03B 21/20* (2006.01)

(52) U.S. Cl.
CPC ............ *H01S 5/11* (2021.01); *G03B 21/2033* (2013.01)

(58) Field of Classification Search
CPC ............................ H01S 5/1042; H01S 5/2027
USPC ....................................................... 372/44.01
See application file for complete search history.

(56) References Cited

U.S. PATENT DOCUMENTS

| | | |
|---|---|---|
| 2004/0048409 A1 | 3/2004 | Biwa et al. |
| 2008/0279242 A1 | 11/2008 | Bour |
| 2011/0169025 A1 | 7/2011 | Kishino et al. |
| 2012/0222732 A1 | 9/2012 | Choi |
| 2014/0042387 A1 | 2/2014 | Yang et al. |
| 2014/0264260 A1 | 9/2014 | Chang et al. |
| 2014/0363912 A1 | 12/2014 | Ohlsson et al. |
| 2014/0366022 A1 | 12/2014 | Chinnamani et al. |
| 2015/0170901 A1 | 6/2015 | Motayed et al. |
| 2015/0221814 A1 | 8/2015 | Ohlsson et al. |
| 2016/0013365 A1 | 1/2016 | Chun et al. |

(Continued)

FOREIGN PATENT DOCUMENTS

| | | |
|---|---|---|
| CN | 104766910 | 7/2015 |
| JP | H06188450 | 7/1994 |

(Continued)

*Primary Examiner* — Tuan N Nguyen
(74) *Attorney, Agent, or Firm* — JCIPRNET

(57) ABSTRACT

The light emitting device includes a substrate, and a laminated structure including columnar parts, wherein the columnar parts include a first semiconductor layer of a first conductivity type, a second semiconductor layer of a second conductivity type, and a light emitting layer disposed between the first semiconductor layer and the second semiconductor layer, the light emitting layer has a c-plane and a facet plane, the second semiconductor layer is disposed on the c-plane and the facet plane, the first semiconductor layer has a first portion and a second portion smaller in diametrical size than the first portion, the second portion is disposed between the substrate and the first portion, and the c-plane and the second portion overlap each other, and the c-plane is smaller in diametrical size than the second portion in a plan view from a stacking direction of the first semiconductor layer and the light emitting layer.

8 Claims, 5 Drawing Sheets

(56) References Cited

U.S. PATENT DOCUMENTS

| | | |
|---|---|---|
| 2016/0027961 A1 | 1/2016 | Mi et al. |
| 2016/0087150 A1 | 3/2016 | Ristic et al. |
| 2017/0301825 A1 | 10/2017 | Ohlsson et al. |
| 2018/0351037 A1 | 12/2018 | Zhang et al. |
| 2019/0267775 A1 | 8/2019 | Noda et al. |
| 2020/0035860 A1 | 1/2020 | Michiue |
| 2020/0041889 A1 | 2/2020 | Ishizawa et al. |
| 2020/0044418 A1 | 2/2020 | Nishioka et al. |
| 2020/0106244 A1 | 4/2020 | Noda et al. |
| 2020/0279974 A1 | 9/2020 | Noda et al. |
| 2020/0313038 A1* | 10/2020 | Ishizawa ............ H01L 33/46 |
| 2020/0313040 A1 | 10/2020 | Nishioka et al. |
| 2020/0358036 A1 | 11/2020 | Yokoyama et al. |
| 2021/0005781 A1 | 1/2021 | Michiue |

FOREIGN PATENT DOCUMENTS

| | | |
|---|---|---|
| JP | 2003282942 | 10/2003 |
| JP | 2013239718 | 11/2013 |
| JP | 2016021556 | 2/2016 |
| JP | 2016521459 | 7/2016 |
| JP | 2016527706 | 9/2016 |
| JP | 2018133517 | 8/2018 |
| JP | 2018190794 | 11/2018 |
| JP | 2019502257 | 1/2019 |
| JP | 2019149503 | 9/2019 |
| JP | 2019192889 | 10/2019 |
| JP | 2020024978 | 2/2020 |
| JP | 2020024982 | 2/2020 |
| JP | 2020057640 | 4/2020 |
| JP | 2020141048 | 9/2020 |
| JP | 2020161623 | 10/2020 |
| JP | 2020170759 | 10/2020 |
| JP | 2020184481 | 11/2020 |
| KR | 1020120055390 | 5/2012 |
| WO | 2011117056 | 9/2011 |
| WO | 2018062252 | 4/2018 |

* cited by examiner

LIGHT EMITTING DEVICE, PROJECTOR, AND DISPLAY

CROSS-REFERENCE TO RELATED APPLICATIONS

The present application is based on, and claims priority from JP Application Serial No. 2021-041217, filed Mar. 15, 2021, the disclosure of which is hereby incorporated by reference herein in its entirety.

BACKGROUND

1. Technical Field

The present disclosure relates to a light emitting device, a projector, and a display.

2. Related Art

Semiconductor lasers are promising as high-luminance next-generation light sources. In particular, a semiconductor laser to which nano-columns are applied is expected to be able to realize narrow-radiation angle high-power light emission due to an effect of a photonic crystal derived from the nano-columns.

For example, in JP-A-2020-57640 (Document 1), there is described a light emitting device provided with a columnar part having a first semiconductor layer, a second semiconductor layer different in conductivity type from the first semiconductor layer, and a light emitting layer disposed between the first semiconductor layer and the second semiconductor layer. In Document 1, the first semiconductor layer and the light emitting layer have a c-plane and a facet plane.

In the light emitting device provided with such a columnar part as described above, a crystal defect is apt to occur in a side surface of the columnar part. The crystal defect forms a leakage path of an electrical current between an n-type semiconductor layer and a p-type semiconductor layer in some cases.

SUMMARY

A light emitting device according to an aspect of the present disclosure includes a substrate, and a laminated structure provided to the substrate, and including a plurality of columnar parts, wherein the columnar part includes a first semiconductor layer of a first conductivity type, a second semiconductor layer of a second conductivity type different from the first conductivity type, and a light emitting layer disposed between the first semiconductor layer and the second semiconductor layer, the first semiconductor layer is disposed between the substrate and the light emitting layer, the light emitting layer has a c-plane and a facet plane, the second semiconductor layer is disposed on the c-plane and the facet plane, the first semiconductor layer has a first portion and a second portion smaller in diametrical size than the first portion, the second portion is disposed between the substrate and the first portion, and the c-plane and the second portion overlap each other, and the c-plane is smaller in diametrical size than the second portion in a plan view from a stacking direction of the first semiconductor layer and the light emitting layer.

A projector according to another aspect of the present disclosure includes the light emitting device according to the above aspect.

A display according to another aspect of the present disclosure includes the light emitting device according to the above aspect.

DESCRIPTION OF AN EXEMPLARY EMBODIMENT

A preferred embodiment of the present disclosure will hereinafter be described in detail using the drawings. It should be noted that the embodiment described hereinafter does not unreasonably limit the contents of the present disclosure as set forth in the appended claims. Further, all of the constituents described hereinafter are not necessarily essential elements of the present disclosure.

1. Light Emitting Device
1.1. Overall Configuration

Figure 1:
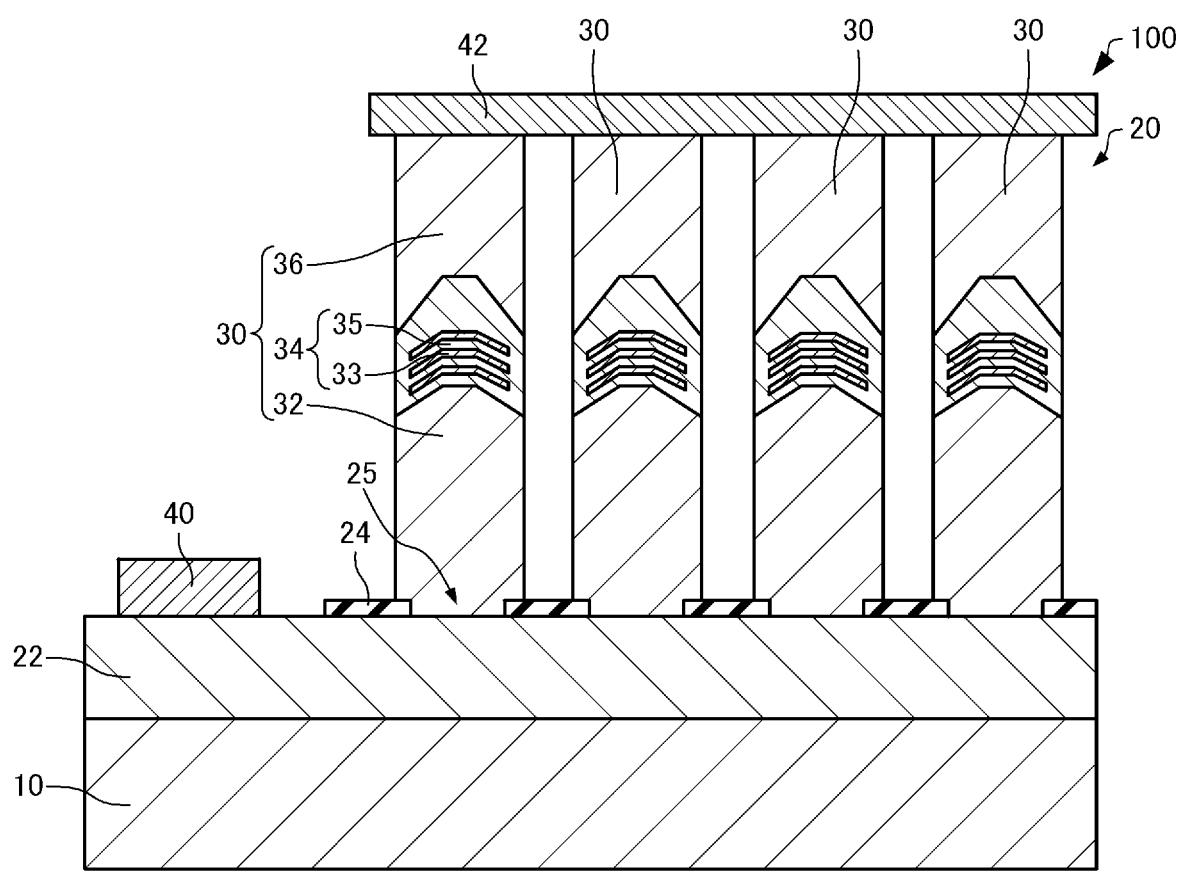
FIG. 1 is a cross-sectional view schematically showing a light emitting device according to the embodiment.

First, a light emitting device according to the present embodiment will be described with reference to the drawings. FIG. 1 is a cross-sectional view schematically showing a light emitting device 100 according to the present embodiment.

As shown in FIG. 1, the light emitting device 100 has a substrate 10, a laminated structure 20, a first electrode 40, and a second electrode 42. The light emitting device 100 is, for example, a semiconductor laser.

The substrate 10 is, for example, an Si substrate, a GaN substrate, a sapphire substrate, or an SiC substrate.

The laminated structure 20 is provided to the substrate 10. In the illustrated example, the laminated structure 20 is disposed on the substrate 10. The laminated structure 20 has, for example, a buffer layer 22 and columnar parts 30.

In the present specification, when taking a light emitting layer 34 as a reference in a stacking direction of a first semiconductor layer 32 and the light emitting layer (hereinafter also referred to simply as a "stacking direction"), the description will be presented assuming a direction from the light emitting layer 34 toward a second semiconductor layer 36 as an "upward direction," and a direction from the light emitting layer 34 toward the first semiconductor layer 32 as a "downward direction." Further, a direction perpendicular to the stacking direction is also referred to as an "in-plane direction."

The buffer layer 22 is disposed on the substrate 10. The buffer layer 22 is, for example, an Si-doped n-type GaN layer. On the buffer layer 22, there is disposed an insulating layer 24.

The insulating layer 24 functions as a mask layer for forming the columnar parts 30. The insulating layer 24 has a plurality of opening parts 25. The opening parts 25 are each a hole penetrating the insulating layer 24. The insulating layer 24 is, for example, a silicon oxide layer, a silicon nitride layer, a silicon layer, a titanium oxide layer, a titanium nitride layer, an aluminum oxide layer, a tantalum oxide layer, a hafnium oxide layer, or a germanium layer.

The columnar parts 30 are disposed on the buffer layer 22. The columnar parts 30 each have a columnar shape protruding upward from the buffer layer 22. In other words, the columnar parts 30 protrude upward from the substrate 10 via the buffer layer 22. The columnar part 30 is also referred to as, for example, a nano-column, a nano-wire, a nano-rod, or a nano-pillar. The planar shape of the columnar part 30 is, for example, a polygon or a circle.

The diametrical size of the columnar part 30 is, for example, no smaller than 50 nm and no larger than 500 nm. By setting the diametrical size of the columnar part 30 to be no larger than 500 nm, it is possible to obtain the light emitting layer 34 made of crystal high in quality, and at the same time, it is possible to reduce a distortion inherent in the light emitting layer 34. Thus, it is possible to amplify the light generated in the light emitting layer 34 with high efficiency.

It should be noted that when the planar shape of the columnar part 30 is a circle, the "diametrical size of the columnar part" means the diameter of the circle, and when the planar shape of the columnar part 30 is not a circular shape, the "diametrical size of the columnar part" means the diameter of the minimum bounding circle. For example, when the planar shape of the columnar part 30 is a polygonal shape, the diametrical size of the columnar part is the diameter of a minimum circle including the polygonal shape inside, and when the planar shape of the columnar part 30 is an ellipse, the diametrical size of the columnar part 30 is the diameter of a minimum circle including the ellipse inside. Further, regarding a diametrical size of each of the layers constituting the columnar part, similarly, when the planar shape of each of the layers is a circle, the diametrical size means the diameter of the circle, and when the planar shape of each of the layers is not a circular shape, the diametrical size means the diameter of the minimum bounding circle.

The number of the columnar parts 30 disposed is two or more. An interval between the columnar parts 30 adjacent to each other is, for example, no smaller than 1 nm and no larger than 500 nm. The plurality of columnar parts 30 is arranged at a predetermined pitch in a predetermined direction when viewed from the stacking direction. The plurality of columnar parts 30 is arranged so as to form, for example, a triangular lattice or a square lattice. The plurality of columnar parts 30 can develop an effect of a photonic crystal.

It should be noted that the "pitch of the columnar parts" means a distance between the centers of the columnar parts 30 adjacent to each other along the predetermined direction. When the planar shape of the columnar part 30 is a circle, the "center of the columnar part" means the center of the circle, and when the planar shape of the columnar part 30 is not a circular shape, the "center of the columnar part" means the center of the minimum bounding circle. For example, when the planar shape of the columnar part 30 is a polygonal shape, the center of the columnar part 30 is the center of a minimum circle including the polygonal shape inside, and when the planar shape of the columnar part 30 is an ellipse, the center of the columnar part 30 is the center of a minimum circle including the ellipse inside.

The columnar parts 30 each have the first semiconductor layer 32, the light emitting layer 34, and the second semiconductor layer 36. It should be noted that the detailed shape and so on of the columnar parts 30 will be described later.

The first semiconductor layer 32 is disposed on the buffer layer 22. The first semiconductor layer 32 is disposed between the substrate 10 and the light emitting layer 34. The first semiconductor layer 32 is, for example, an Si-doped n-type GaN layer.

The light emitting layer 34 is disposed on the first semiconductor layer 32. The light emitting layer 34 is disposed between the first semiconductor layer 32 and the second semiconductor layer 36. The light emitting layer 34 generates light in response to injection of an electrical current. The light emitting layer 34 has, for example, well layers 33 and barrier layers 35. The well layers 33 and the barrier layers 35 are each an i-type semiconductor layer which is not intentionally doped with any impurity. The well layers 33 are each, for example, an InGaN layer. The barrier layers 35 are each, for example, a GaN layer. The light emitting layer 34 has an MQW (Multiple Quantum Well) structure constituted by the well layers 33 and the barrier layers 35.

It should be noted that the number of the well layers 33 and the barrier layers 35 constituting the light emitting layer 34 is not particularly limited. For example, the number of the well layers 33 disposed can be one, and in this case, the light emitting layer 34 has an SQW (Single Quantum Well) structure.

The second semiconductor layer 36 is disposed on the light emitting layer 34. The second semiconductor layer 36 is a layer different in conductivity type from the first semiconductor layer 32. The second semiconductor layer 36 is, for example, an Mg-doped p-type GaN layer. The first semiconductor layer 32 and the second semiconductor layer 36 are cladding layers having a function of confining the light in the light emitting layer 34.

It should be noted that although not shown in the drawings, an OCL (Optical Confinement Layer) made of an i-type InGaN layer can be disposed between the first semiconductor layer 32 and the light emitting layer 34. Further, although not shown in the drawings, the OCL made of the i-type InGaN layer can be disposed between the light emitting layer 34 and the second semiconductor layer 36. Further, the second semiconductor layer 36 can be provided with an EBL (Electron Blocking Layer) made of a p-type AlGaN layer.

In the light emitting device 100, there is constituted a pin diode by the second semiconductor layer 36 of the p-type, the light emitting layer 34 of the i-type doped with no impurity, and the first semiconductor layer 32 of the n-type. In the light emitting device 100, when a forward bias voltage of the pin diode is applied between the first electrode 40 and the second electrode 42, an electrical current is injected into the light emitting layer 34, and recombination of electrons and holes occurs in the light emitting layer 34. The recombination causes light emission. The light generated in the light emitting layer 34 propagates in an in-plane direction to form a standing wave due to the effect of the photonic crystal caused by the plurality of columnar parts 30, and is then gained by the light emitting layer 34 to cause laser oscillation. Then, the light emitting device 100 emits positive first-order diffracted light and negative first-order diffracted light as a laser beam in the stacking direction.

It should be noted that it is also possible to dispose a reflecting layer between the substrate 10 and the buffer layer 22, or below the substrate 10 although not shown in the drawings. The reflecting layer is, for example, a DBR (Distributed Bragg Reflector) layer. Due to the reflecting layer, it is possible to reflect the light generated in the light emitting layer 34, and thus, it is possible for the light emitting device 100 to emit the light only from the second electrode 42 side.

The first electrode 40 is disposed on the buffer layer 22. It is also possible for the buffer layer 22 to have ohmic contact with the first electrode 40. The first electrode 40 is electrically coupled to the first semiconductor layer 32. In the illustrated example, the first electrode 40 is electrically coupled to the first semiconductor layer 32 via the buffer layer 22. The first electrode 40 is one of electrodes for injecting the electrical current into the light emitting layer 34. As the first electrode 40, there is used, for example, what is obtained by stacking a Cr layer, an Ni layer, and an Au layer in this order from the buffer layer 22 side.

The second electrode 42 is disposed on the second semiconductor layer 36. The second electrode 42 is disposed at the opposite side to the substrate 10 of the laminated structure 20. The second electrode 42 is electrically coupled to the second semiconductor layer 36. It is also possible for the second semiconductor layer 36 to have ohmic contact with the second electrode 42. The second electrode is the other of the electrodes for injecting the electrical current into the light emitting layer 34. As the second electrode 42, there is used, for example, ITO (indium tin oxide).

1.2. Detailed Shape etc. of Columnar Part

Figure 2:
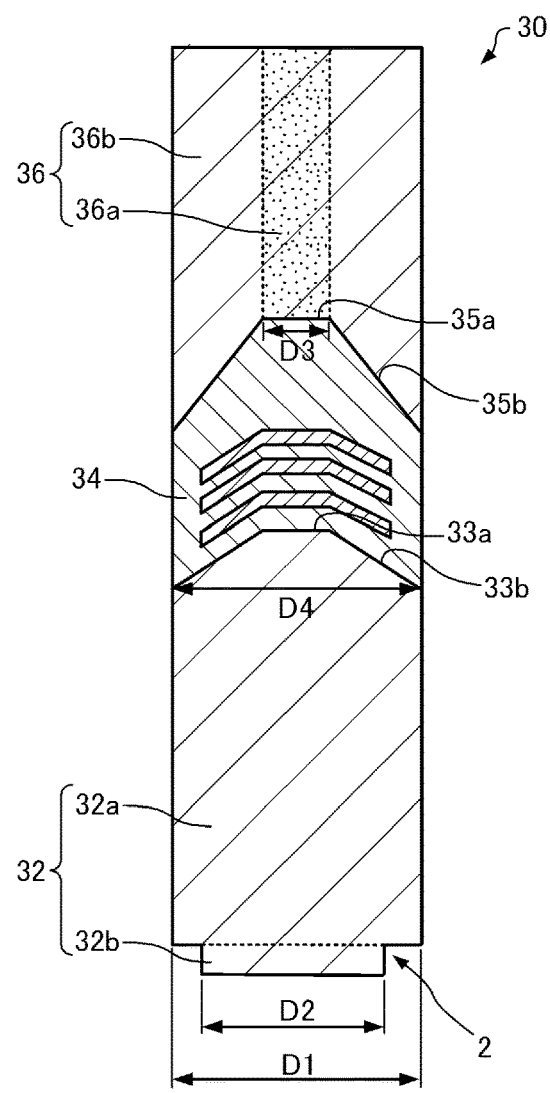
FIG. 2 is a cross-sectional view schematically showing a columnar part of the light emitting device according to the embodiment.
Figure 3:
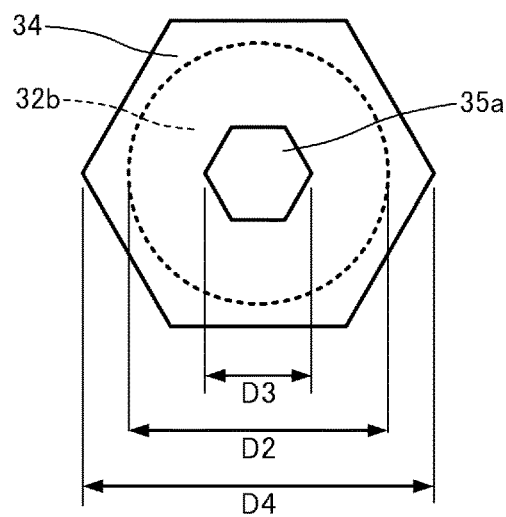
FIG. 3 is a plan view schematically showing the columnar part of the light emitting device according to the embodiment.

FIG. 2 is a cross-sectional view schematically showing the columnar part 30. FIG. 3 is a plan view schematically showing the columnar part 30. It should be noted that FIG. 3 illustrates only a second portion 32b of the first semiconductor layer 32, the light emitting layer 34, and a c-plane 35a of the light emitting layer 34 for the sake of convenience.

The first semiconductor layer 32, the light emitting layer 34, and the second semiconductor layer 36 are made of, for example, a group-III nitride semiconductor, and have a wurtzite crystal structure.

As shown in FIG. 2, the first semiconductor layer 32 has a first portion 32a and the second portion 32b.

The first portion 32a is disposed between the second portion 32b and the light emitting layer 34. The first portion 32a is disposed on the second portion 32b and the insulating layer 24. The first portion 32a has the c-plane 33a and a facet plane 33b. The c-plane 33a is parallel to a principal surface of the substrate 10, and the facet surface 33b are tilted with respect to the principal surface of the substrate 10. The principal surface of the substrate 10 is a surface on which the buffer layer 22 is formed.

The second portion 32b is disposed between the substrate 10 and the first portion 32a. In the example shown in FIG. 1, the second portion 32b is disposed on the buffer layers 22. As shown in FIG. 1, the second portion 32b is provided to each of the opening parts 25 of the insulating layer 24. The insulating layer 24 is disposed between the substrate 10 and the first portion 32a.

In the plan view from the stacking direction (hereinafter also referred to simply as "in the plan view"), the first portion 32a and the second portion 32b overlap each other. In the plan view, the second portion 32b is disposed only inside the outer edge of the first portion 32a. The diametrical size D2 of the second portion 32b is smaller than the diametrical size D1 of the first portion 32a. Since the diametrical size D1 of the first portion 32a and the diametrical size D2 of the second portion 32b are different from each other, a step 2 is formed at a boundary between the first portion 32a and the second portion 32b.

It should be noted that when the planar shape of the first portion 32a is a circle, the "diametrical size of the first portion" means the diameter of the circle, and when the planar shape of the first portion 32a is not a circular shape, the "diametrical size of the first portion" means the diameter of the minimum bounding circle. Similarly, when the planar shape of the second portion 32b is a circle, the "diametrical size of the second portion" means the diameter of the circle, and when the planar shape of the second portion 32b is not a circular shape, the "diametrical size of the second portion" means the diameter of the minimum bounding circle.

The light emitting layer 34 has the c-plane 35a and the facet plane 35b. In the plan view, the c-plane 35a is surrounded by the facet plane 35b. As shown in FIG. 3, in the plan view, the c-plane 35a and the second portion 32b overlap each other, and the diametrical size D3 of the c-plane 35a is smaller than the diametrical size D2 of the second portion 32b. For example, in the plan view, the c-plane 35a is disposed only inside the outer edge of the second portion 32b. In the plan view, the area of the c-plane 35a entirely overlaps the second portion 32b.

It should be noted that when the shape of the c-plane 35a is a circle, the "diametrical size of the c-plane" means the diameter of the circle, and when the shape of the c-plane 35a is not a circular shape, the "diametrical size of the c-plane" means the diameter of the minimum bounding circle.

The second semiconductor layer 36 is disposed on the c-plane 35a and the facet plane 35b of the light emitting layer 34. It should be noted that although not shown in the drawings, when another layer such as the OCL exists between the light emitting layer 34 and the second semiconductor layer 36, it is possible for the second semiconductor layer 36 to be disposed on the c-plane 35a and the facet plane 35b via the another layer.

In the plan view, the impurity concentration of the second semiconductor layer 36 overlapping the c-plane 35a is higher than the impurity concentration of the second semiconductor layer 36 overlapping the facet plane 35b in the plan view. In other words, the second semiconductor layer 36 has a high concentration portion 36a high in impurity concentration and a low concentration portion 36b lower in impurity concentration than the high concentration portion 36a, wherein the high concentration portion 36a overlaps the c-plane 35a in the plan view, and the low concentration portion 36b overlaps the facet plane 35b in the plan view. When growing the second semiconductor layer 36 epitaxially, the impurity concentration of the second semiconductor layer 36 growing on the c-plane 35a becomes higher than the impurity concentration of the second semiconductor layer 36 growing on the facet plane 35b. Thus, there is formed the second semiconductor layer 36 having the high concentration portion 36a and the low concentration portion 36b.

The high concentration portion 36a is formed along, for example, a central axis of the columnar part 30, and the low concentration portion 36b surrounds the high concentration portion 36a in the plan view. The impurity concentration of the high concentration portion 36a is, for example, about $5 \times 10^{19}$ cm$^{-3}$. The impurity concentration of the low concentration portion 36b is, for example, equal to or less than $2 \times 10^{19}$ cm$^{-3}$. When the impurity concentration of the second semiconductor layer 36 becomes high, namely when the concentration of Mg doped in GaN becomes high, the electrical resistance becomes low.

The diametrical size D4 of the light emitting layer 34 is larger than the diametrical size D3 of the c-plane 35a and the diametrical size D2 of the second portion 32b. For example, in the plan view, the second portion 32b is disposed only inside the outer edge of the light emitting layer 34.

It should be noted that when the planar shape of the light emitting layer 34 is a circle, the "diametrical size of the light emitting layer" means the diameter of the circle, and when the planar shape of the light emitting layer 34 is not a circular shape, the "diametrical size of the light emitting layer" means the diameter of the minimum bounding circle.

Although the light emitting layer 34 of the InGaN type is described above, as the light emitting layer 34, there can be used a variety of types of material system capable of emitting light in response to injection of an electrical current in accordance with the wavelength of the light to be emitted. It is possible to use semiconductor materials of, for example, an AlGaN type, an AlGaAs type, an InGaAs type, an InGaAsP type, an InP type, a GaP type, or an AlGaP type.

Further, although there is described above when the light emitting device 100 is a vertical cavity surface emitting laser using the effect of the photonic crystal, the light emitting device 100 can be a light emitting device such as an LED (light emitting diode) or a resonant light emitting diode.

Further, in the above description, the first portion 32a of the first semiconductor layer 32, the light emitting layer 34, and the second semiconductor layer 36 are the same in diametrical size in FIG. 2, but this is not a limitation, and the diametrical size of the first portion 32a and the diametrical size of the light emitting layer 34 can be different form each other, the diametrical size of the first portion 32a and the diametrical size of the second semiconductor layer 36 can be different from each other, and the diametrical size of the light emitting layer 34 and the diametrical size of the second semiconductor layer 36 can be different from each other. Further, the diametrical size of the first portion 32a of the first semiconductor layer 32 can vary in the stacking direction. For example, the diametrical size of the first portion 32a can gradually increase upward in the stacking direction. Further, the diametrical size of the light emitting layer 34 can vary in the stacking direction. For example, the diametrical size of the light emitting layer 34 can gradually increase upward in the stacking direction. Further, the diametrical size of the second semiconductor layer 36 can vary in the stacking direction. For example, the diametrical size of the second semiconductor layer 36 can gradually increase upward in the stacking direction, or the diametrical size of the second semiconductor layer 36 can gradually decrease upward in the stacking direction.

1.3. Functions and Advantages

In the light emitting device 100, the first semiconductor layer 32 has the first portion 32a, and the second portion 32b smaller in diametrical size than the first portion 32a, and in the plan view, the c-plane 35a of the light emitting layer 34 and the second portion 32b overlap each other, and the diametrical size D3 of the c-plane 35a is smaller than the diametrical size D2 of the second portion 32b. Therefore, in the light emitting device 100, it is possible to reduce the electrical current flowing on the side surface of the columnar part 30 where the crystal defect is apt to occur. Thus, it is possible to reduce the leakage of the electrical current between the first semiconductor layer 32 and the second semiconductor layer 36. As a result, in the light emitting device 100, it is possible to efficiently inject the electrical current into the light emitting layer 34.

Specifically, in the light emitting device 100, since the first semiconductor layer 32 has the second portion 32b smaller in diametrical size than the first portion 32a, it is possible to reduce the spread of the electrical current in an area below the light emitting layer 34, namely the spread of the electrical current in the first semiconductor layer 32, in the path of the electrical current flowing through the columnar part 30.

Further, in the light emitting device 100, the diametrical size D3 of the c-plane 35a of the light emitting layer 34 is smaller than the diametrical size D2 of the second portion 32b. Here, the electrical resistance of the high concentration portion 36a overlapping the c-plane 35a in the plan view is lower than the electrical resistance of the low concentration portion 36b overlapping the facet plane 35b in the plan view. Therefore, it is possible to reduce the spread of the electrical current in an area above the light emitting layer 34, namely the spread of the electrical current in the second semiconductor layer 36, in the path of the electrical current flowing through the columnar part 30.

As described above, in the light emitting device 100, since the spread of the electrical current flowing through the columnar part 30 can be reduced, it is possible to reduce the electrical current flowing on the side surface of the columnar part 30.

Further, in the light emitting device 100, the diametrical size D3 of the c-plane 35a of the light emitting layer 34 is smaller than the diametrical size D2 of the second portion 32b. Therefore, in the light emitting device 100, it is possible to reduce the electrical current which straddles the crystal defect generated from the step 2, and which does not make a contribution to the light emission compared to when, for example, the diametrical size D3 of the c-plane 35a of the light emitting layer 34 is no smaller than the diametrical size D2 of the second portion 32b. Thus, it is possible to improve the luminous efficiency.

Here, the crystal defect is apt to occur in the step 2 formed at the boundary between the first portion 32a and the second portion 32b. Further, the electrical current straddling the crystal defect does not make a contribution to the light emission. Since in the light emitting device 100, the diametrical size D3 is smaller than the diametrical size D2, it is possible to concentrate the electrical current on the central portion of the first semiconductor layer 32 compared to when, for example, the diametrical size D3 is no smaller than the diametrical size D2, and thus, it is possible to reduce the electrical current straddling the crystal defect generated from the step 2.

In the light emitting device 100, the diametrical size D4 of the light emitting layer 34 is larger than the diametrical size D3 of the c-plane 35a and the diametrical size D2 of the second portion 32b. Therefore, in the light emitting device 100, it is possible to reduce the electrical current flowing on the side surface of the light emitting layer 34. Thus, it is possible to reduce the leakage of the electrical current between the first semiconductor layer and the second semiconductor layer 36. Further, by reducing the electrical current flowing on the side surface of the light emitting layer 34, it is possible to reduce non-radiative recombination on the side surface of the light emitting layer 34.

In the light emitting device 100, the step 2 is formed at the boundary between the first portion 32a and the second portion 32b. Therefore, in the light emitting device 100, the diametrical size D2 of the second portion 32b can be made smaller than the diametrical size D1 of the first portion 32a.

In the light emitting device 100, the substrate 10 is provided with the insulating layer 24 having the opening parts 25, and the second portion 32b is provided to each of the opening parts 25. Therefore, in the light emitting device 100, it is possible to easily form the first semiconductor layer 32 having the first portion 32a and the second portion 32b smaller in diametrical size than the first portion 32a.

In the light emitting device 100, the insulating layer 24 is disposed between the substrate 10 and the first portion 32a. Therefore, in the light emitting device 100, it is possible to easily form the first semiconductor layer 32 having the first portion 32a and the second portion 32b.

In the light emitting device 100, the impurity concentration of the second semiconductor layer 36 overlapping the c-plane 35a is higher than the impurity concentration of the second semiconductor layer 36 overlapping the facet plane 35b in the plan view. Therefore, in the light emitting device 100, it is possible to reduce the spread of the electrical current flowing through the second semiconductor layer 36.

2. Method of Manufacturing Light Emitting Device

Figure 4:
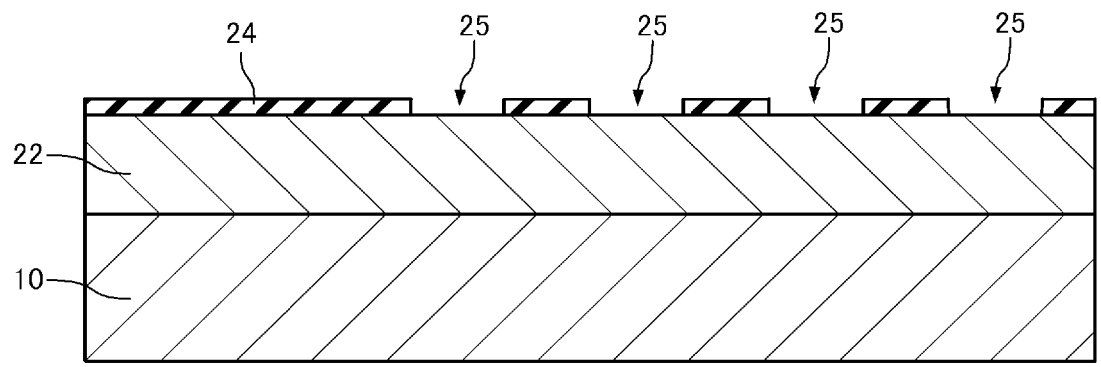
FIG. 4 is a cross-sectional view schematically showing a manufacturing process of the light emitting device according to the embodiment.
Figure 5:
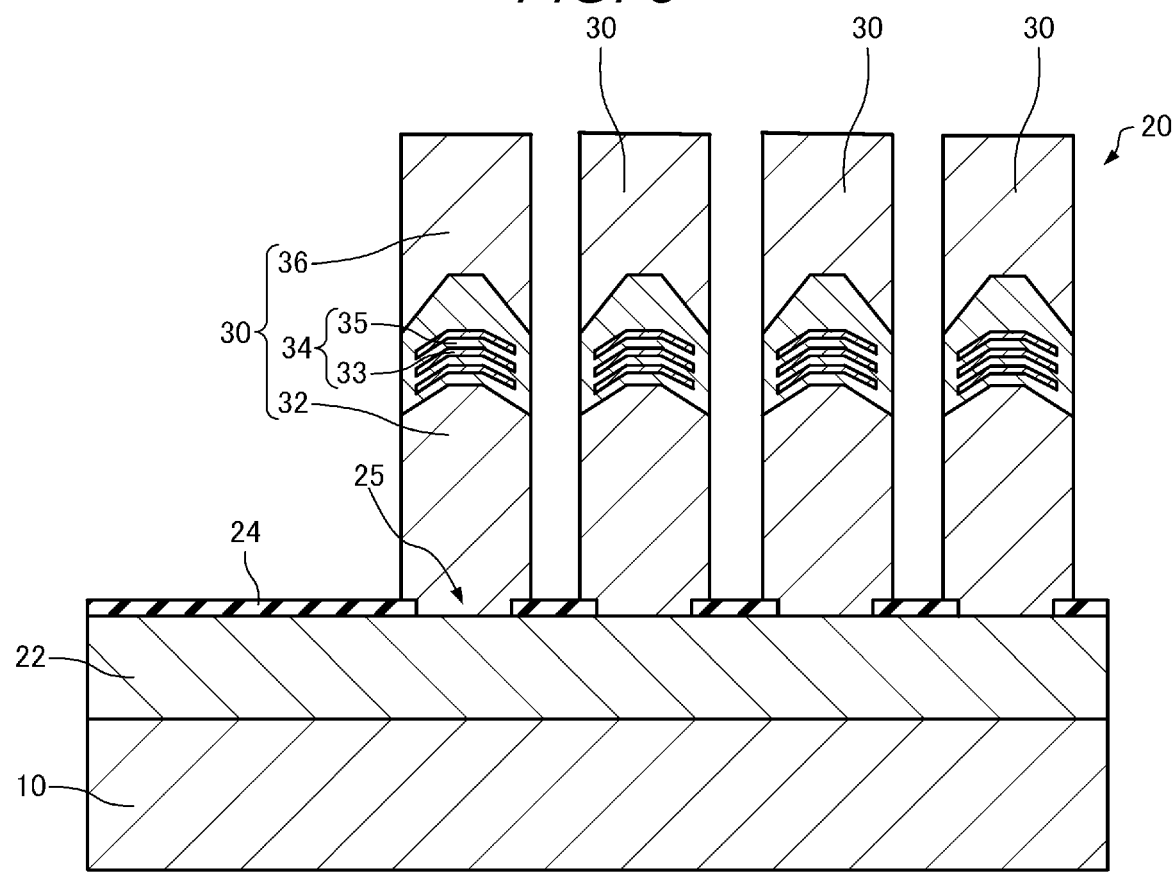
FIG. 5 is a cross-sectional view schematically showing a manufacturing process of the light emitting device according to the embodiment.

Then, a method of manufacturing the light emitting device 100 according to the present embodiment will be described with reference to the drawings. FIG. 4 and FIG. 5 are cross-sectional views schematically showing a manufacturing process of the light emitting device 100 according to the present embodiment.

As shown in FIG. 4, the buffer layer 22 is grown epitaxially on the substrate 10. As the method of achieving the epitaxial growth, there can be cited an MOCVD (Metal Organic Chemical Vapor Deposition) method, an MBE (Molecular Beam Epitaxy) method, and so on.

Then, the insulating layer 24 having the plurality of opening parts 25 is formed on the buffer layer 22. The insulating layer 24 is formed by deposition using, for example, an electron beam evaporation method or a spattering method, and patterning. The patterning is performed using, for example, photolithography and etching. The diametrical size D2 of the second portion 32b is decided by the diametrical size of the opening part 25.

As shown in FIG. 5, the first semiconductor layer 32 is grown epitaxially on the buffer layer 22 using the insulating layer 24 as a mask. As the method of achieving the epitaxial growth, there can be cited the MOCVD method, the MBE method, and so on.

By epitaxially growing the first semiconductor layer 32 using the insulating layer 24 as a mask, the second portion 32b is formed in each of the opening parts 25, and the first portion 32a is formed on the second portion 32b and the insulating layer 24. In such a manner, there is formed the first semiconductor layer 32 having the first portion 32a and the second portion 32b smaller in diametrical size than the first portion 32a. In this step, growth conditions such as a growth temperature and a growth speed are adjusted so that the c-plane 33a and the facet plane 33b are provided to the first semiconductor layer 32.

Then, the light emitting layer 34 is grown epitaxially on the first semiconductor layer 32. As the method of achieving the epitaxial growth, there can be cited the MOCVD method, the MBE method, and so on. In this step, growth conditions such as a growth temperature and a growth speed are adjusted so that the c-plane 35a and the facet plane 35b are provided to the light emitting layer 34.

Then, the second semiconductor layer 36 is grown epitaxially on the light emitting layer 34. As the method of achieving the epitaxial growth, there can be cited the MOCVD method, the MBE method, and so on. By epitaxially growing the second semiconductor layer 36 on the light emitting layer 34 having the c-plane 35a and the facet plane 35b, the high concentration portion 36a high in impurity concentration is formed on the c-plane 35a, and the low concentration portion 36b low in impurity concentration is formed on the facet plane 35b.

Due to the steps described hereinabove, it is possible to form the laminated structure 20 having the columnar parts 30.

Then, the first electrode 40 is formed on the buffer layer 22, and the second electrode 42 is formed on the second semiconductor layer 36. The first electrode 40 and the second electrode 42 are formed using, for example, a vacuum deposition method. It should be noted that the order of the formation of the first electrode 40 and the formation of the second electrode 42 is not particularly limited. Subsequently, the substrate 10 is cut into a predetermined shape.

Due to the steps described hereinabove, it is possible to manufacture the light emitting device 100.

3. Projector

Figure 6:
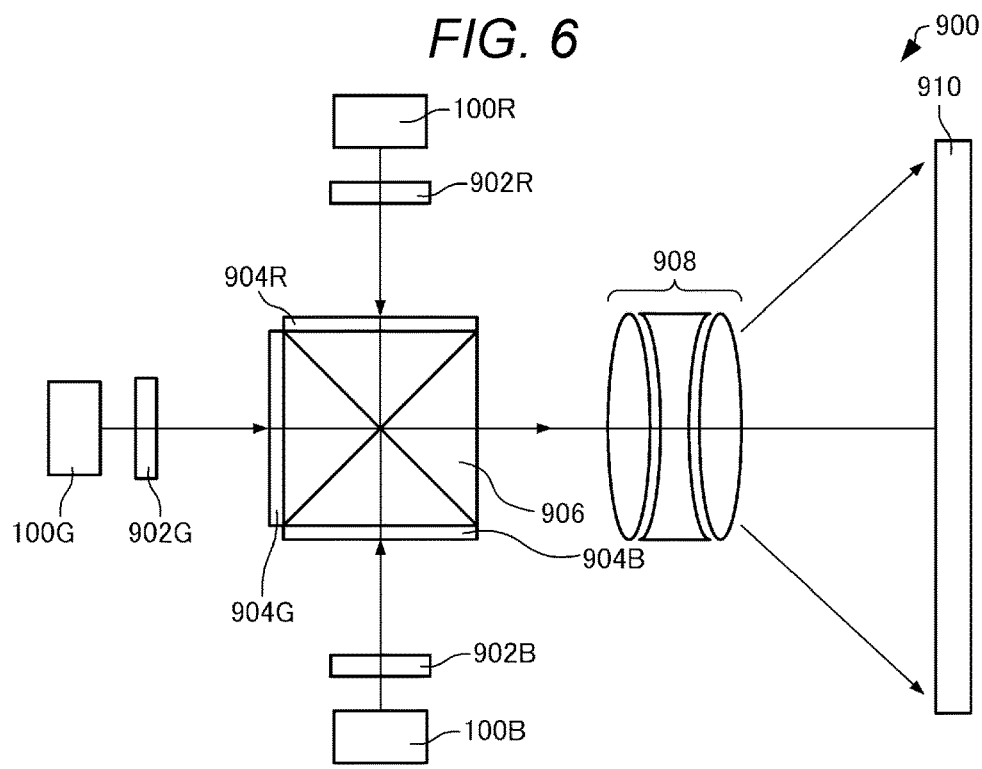
FIG. 6 is a diagram schematically showing a projector according to the embodiment.

Then, a projector according to the present embodiment will be described with reference to the drawings. FIG. 6 is a diagram schematically showing the projector 900 according to the present embodiment.

The projector 900 has, for example, the light emitting devices 100 as light sources.

The projector 900 includes a housing not shown, a red light source 100R, a green light source 100G, and a blue light source 100B which are disposed inside the housing, and respectively emit red light, green light, and blue light. It should be noted that in FIG. 6, the red light source 100R, the green light source 100G, and the blue light source 100B are simplified for the sake of convenience.

The projector 900 further includes a first optical element 902R, a second optical element 902G, a third optical element 902B, a first light modulation device 904R, a second light modulation device 904G, a third light modulation device 904B, and a projection device 908 all installed inside the housing. The first light modulation device 904R, the second light modulation device 904G, and the third light modulation device 904B are each, for example, a transmissive liquid crystal light valve. The projection device 908 is, for example, a projection lens.

The light emitted from the red light source 100R enters the first optical element 902R. The light emitted from the red light source 100R is collected by the first optical element 902R. It should be noted that the first optical element 902R can be provided with other functions than the light collection. The same applies to the second optical element 902G and the third optical element 902B described later.

The light collected by the first optical element 902R enters the first light modulation device 904R. The first light modulation device 904R modulates the incident light in accordance with image information. Then, the projection device 908 projects an image formed by the first light modulation device 904R on a screen 910 in an enlarged manner.

The light emitted from the green light source 100G enters the second optical element 902G. The light emitted from the green light source 100G is collected by the second optical element 902G.

The light collected by the second optical element 902G enters the second light modulation device 904G. The second light modulation device 904G modulates the incident light in accordance with the image information. Then, the projection device 908 projects an image formed by the second light modulation device 904G on the screen 910 in an enlarged manner.

The light emitted from the blue light source 100B enters the third optical element 902B. The light emitted from the blue light source 100B is collected by the third optical element 902B.

The light collected by the third optical element 902B enters the third light modulation device 904B. The third light modulation device 904B modulates the incident light in accordance with the image information. Then, the projection device 908 projects an image formed by the third light modulation device 904B on the screen 910 in an enlarged manner.

Further, it is possible for the projector 900 to include a cross dichroic prism 906 for combining the light emitted from the first light modulation device 904R, the light emitted from the second light modulation device 904G, and the light emitted from the third light modulation device 904B with each other to guide the light thus combined to the projection device 908.

The three colors of light respectively modulated by the first light modulation device 904R, the second light modulation device 904G, and the third light modulation device 904B enter the cross dichroic prism 906. The cross dichroic prism 906 is formed by bonding four rectangular prisms to each other, and is provided with a dielectric multilayer film for reflecting the red light and a dielectric multilayer film for reflecting the blue light disposed on the inside surfaces. The three colors of light are combined with each other by these dielectric multilayer films, and thus, the light representing a color image is formed. Then, the light thus combined is projected on the screen 910 by the projection device 908, and thus, an enlarged image is displayed.

It should be noted that it is possible for the red light source 100R, the green light source 100G, and the blue light source 100B to directly form the images by controlling the light emitting devices 100 as the pixels of the image in accordance with the image information without using the first light modulation device 904R, the second light modulation device 904G, and the third light modulation device 904B. Then, it is also possible for the projection device 908 to project the images formed by the red light source 100R, the green light source 100G, and the blue light source 100B on the screen 910 in an enlarged manner.

Further, although the transmissive liquid crystal light valves are used as the light modulation devices in the example described above, it is also possible to use light valves other than the liquid crystal light valves, or to use reflective light valves. As such light valves, there can be cited, for example, reflective liquid crystal light valves and Digital Micromirror Device™. Further, the configuration of the projection device is appropriately modified in accordance with the type of the light valves used.

Further, it is also possible to apply the light source to a light source device of a scanning type image display device having a scanning unit as an image forming device which scans the surface of the screen with the light from the light source to thereby display an image with a desired size on the display surface.

4. Display

Figure 7:
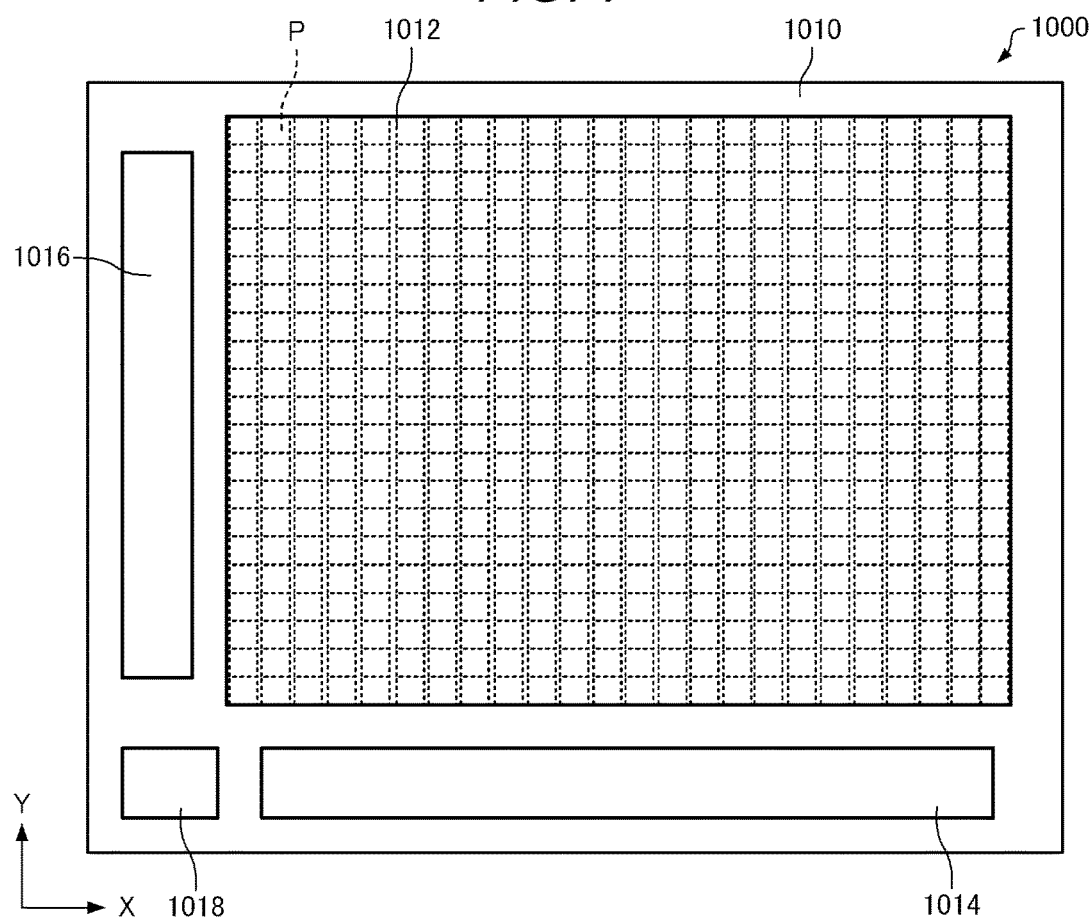
FIG. 7 is a plan view schematically showing a display according to the embodiment.
Figure 8:
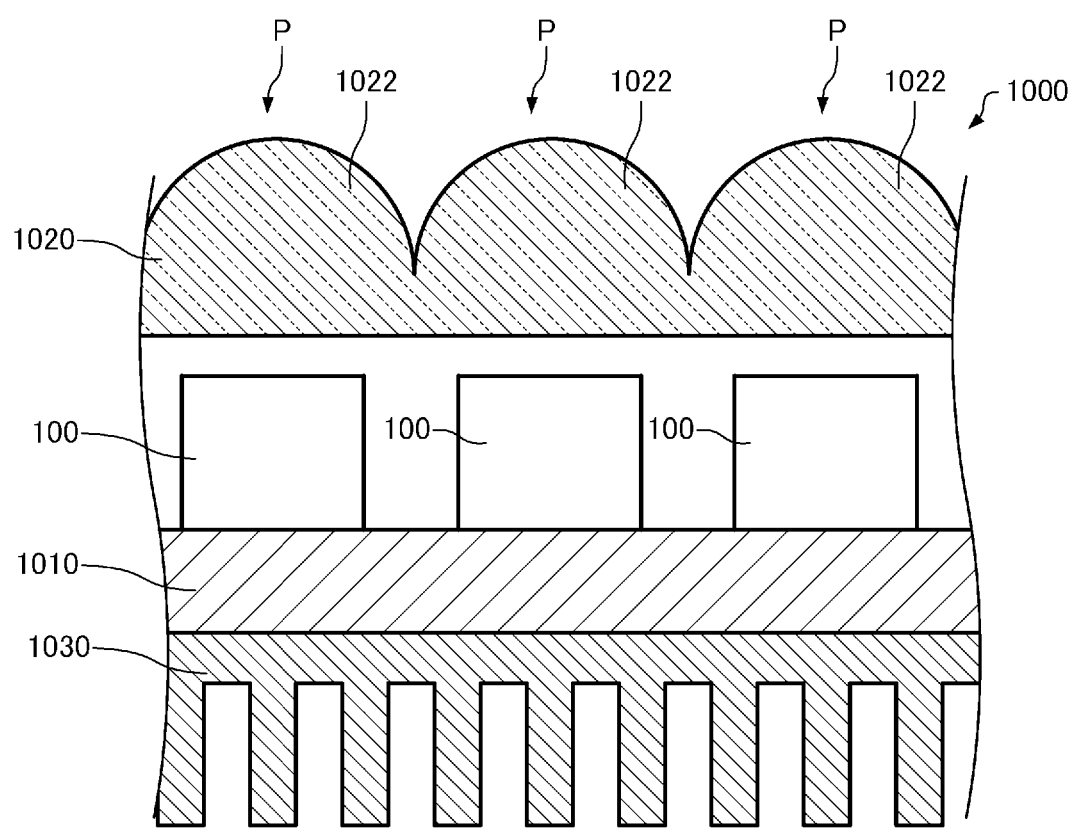
FIG. 8 is a cross-sectional view schematically showing the display according to the embodiment.

Then, a display according to the present embodiment will be described with reference to the drawings. FIG. 7 is a plan view schematically showing the display 1000 according to the present embodiment. FIG. 8 is a cross-sectional view schematically showing the display 1000 according to the present embodiment. In FIG. 7, the X axis and the Y axis are illustrated as two axes perpendicular to each other for the sake of convenience.

The display 1000 has, for example, the light emitting devices 100 as light sources.

The display 1000 is a display device for displaying an image. The image includes what displays only character information. The display 1000 is a self-luminous type display. The display 1000 has a circuit board 1010, a lens array 1020, and a heatsink 1030 as shown in FIG. 7 and FIG. 8.

On the circuit board 1010, there is mounted a drive circuit for driving the light emitting devices 100. The drive circuit is a circuit including, for example, a CMOS (Complementary Metal Oxide Semiconductor). The drive circuit drives the light emitting devices 100 based on, for example, the image information input thereto. Although not shown in the drawings, on the circuit board 1010, there is disposed a light transmissive substrate for protecting the circuit board 1010.

The circuit board 1010 has a display area 1012, a data line drive circuit 1014, a scanning line drive circuit 1016, and a control circuit 1018.

The display area 1012 is formed of a plurality of pixels P. The pixels P are arranged along the X axis and the Y axis in the illustrated example.

Although not shown in the drawings, the circuit board 1010 is provided with a plurality of scanning lines and a plurality of data lines. For example, the scanning lines extend along the X axis, and the data lines extend along the Y axis. The scanning lines are coupled to the scanning line drive circuit 1016. The data lines are coupled to the data line drive circuit 1014. The pixels P are disposed so as to correspond to the respective intersections between the scanning lines and the data lines.

Each of the pixels P has, for example one of the light emitting devices 100, a single lens 1022, and a pixel circuit not shown. The pixel circuit includes a switching transistor functioning as a switch for the pixel P, wherein the gate of the switching transistor is coupled to the scanning line, and one of the source and the drain thereof is coupled to the data line.

The data line drive circuit 1014 and the scanning line drive circuit 1016 are circuits for controlling the drive of the light emitting devices 100 respectively constituting the pixels P. The control circuit 1018 controls the display of the image.

The control circuit 1018 is supplied with image data from a higher-level circuit. The control circuit 1018 supplies a variety of signals based on the image data to the data line drive circuit 1014 and the scanning line drive circuit 1016.

When the scanning line drive circuit 1016 activates a scanning signal to thereby select the scanning line, the switching transistor of the pixel P thus selected is set to an ON state. On this occasion, by the data line drive circuit 1014 supplying the pixel P thus selected with the data signal from the data line, the light emitting device 100 of the pixel P thus selected emits light in accordance with the data signal.

The lens array 1020 has a plurality of lenses 1022. The lenses 1022 are disposed, for example, so as to correspond one-to-one to the light emitting devices 100. The light emitted from the light emitting device 100 enters corresponding one of the lenses 1022.

The heatsink 1030 has contact with the circuit board 1010. The material of the heatsink 1030 is metal such as copper or aluminum. The heatsink 1030 releases heat generated in the light emitting devices 100.

The light emitting device according to the embodiment described above can also be used for other devices than the projector and the display. As the applications other than the projector and the display, there can be cited a light source of, for example, indoor and outdoor illumination, a laser printer, a scanner, an in-car light, sensing equipment using light, or communication equipment. Further, the light emitting device according to the embodiment described above can also be used for a display device of a head-mounted display.

The present disclosure includes configurations substantially the same as the configuration described as the embodiment such as configurations having the same function, the same way, and the same result, or configurations having the same object and the same advantage. Further, the present disclosure includes configurations obtained by replacing a non-essential part of the configuration described as the embodiment. Further, the present disclosure includes configurations providing the same functions and advantages, and configurations capable of achieving the same object as those of the configuration described as the embodiment. Further, the present disclosure includes configurations obtained by adding a known technology to the configuration described as the embodiment.

The following contents derive from the embodiment and the modified example described above.

A light emitting device according to an aspect includes a substrate, and a laminated structure provided to the substrate, and including a plurality of columnar parts, wherein the columnar part includes a first semiconductor layer of a first conductivity type, a second semiconductor layer of a second conductivity type different from the first conductivity type, and a light emitting layer disposed between the first semiconductor layer and the second semiconductor layer, the first semiconductor layer is disposed between the substrate and the light emitting layer, the light emitting layer has a c-plane and a facet plane, the second semiconductor layer is disposed on the c-plane and the facet plane, the first semiconductor layer has a first portion and a second portion smaller in diametrical size than the first portion, the second portion is disposed between the substrate and the first portion, and the c-plane and the second portion overlap each other, and the c-plane is smaller in diametrical size than the second portion in a plan view from a stacking direction of the first semiconductor layer and the light emitting layer.

According to this light emitting device, it is possible to reduce the electrical current flowing on the side surface of the columnar part where the crystal defect is apt to occur. Thus, it is possible to reduce the leakage of the electrical current between the first semiconductor layer and the second semiconductor layer.

In the light emitting device according to the aspect, the light emitting layer may be larger in diametrical size than the c-plane and the second portion.

According to this light emitting device, it is possible to reduce the current which straddles the crystal defect generated from the step at the boundary between the first portion and the second portion of the first semiconductor layer, and which does not make a contribution to the light emission.

In the light emitting device according to the aspect, a step may be formed at a boundary between the first portion and the second portion.

According to this light emitting device, it is possible to make the diametrical size of the second portion smaller than the diametrical size of the first portion.

In the light emitting device according to the aspect, the substrate may be provided with an insulating layer having an opening part, and the second portion may be disposed in the opening part.

According to this light emitting device, it is possible to easily form the first semiconductor layer having the first portion and the second portion smaller in diametrical size than the first portion.

In the light emitting device according to the aspect, the insulating layer may be disposed between the substrate and the first portion.

According to this light emitting device, it is possible to easily form the first semiconductor layer having the first portion and the second portion smaller in diametrical size than the first portion.

In the light emitting device according to the aspect, in the plan view, a portion of the second semiconductor layer overlapping the c-plane may be higher in impurity concentration than a portion of the second semiconductor layer overlapping the facet plane.

According to this light emitting device, it is possible to reduce the spread of the electrical current flowing through the second semiconductor layer.

A projector according to an aspect includes the light emitting device according to the above aspect.

A display according to an aspect includes the light emitting device according to the above aspect.

What is claimed is:

1. A light emitting device comprising:
a substrate; and
a laminated structure including a plurality of columnar parts, wherein
the columnar part includes
a first semiconductor layer of a first conductivity type,
a second semiconductor layer of a second conductivity type different from the first conductivity type, and
a light emitting layer disposed between the first semiconductor layer and the second semiconductor layer,
the first semiconductor layer is disposed between the substrate and the light emitting layer,
the light emitting layer has a c-plane and a facet plane,
the second semiconductor layer is disposed on the c-plane and the facet plane,
the first semiconductor layer has a first portion and a second portion smaller in diametrical size than the first portion,
the second portion is disposed between the substrate and the first portion, and
the c-plane and the second portion overlap each other, and the c-plane is smaller in diametrical size than the second portion in a plan view from a stacking direction of the first semiconductor layer and the light emitting layer.

2. The light emitting device according to claim 1, wherein the light emitting layer is larger in diametrical size than the c-plane and the second portion.

3. The light emitting device according to claim 1, wherein a step is formed at a boundary between the first portion and the second portion.

4. The light emitting device according to claim 1, wherein the substrate is provided with an insulating layer having an opening part, and
the second portion is disposed in the opening part.

5. The light emitting device according to claim 4, wherein the insulating layer is disposed between the substrate and the first portion.

6. The light emitting device according to claim 1, wherein in the plan view, a portion of the second semiconductor layer overlapping the c-plane is higher in impurity concentration than a portion of the second semiconductor layer overlapping the facet plane.

7. A projector comprising:
the light emitting device according to claim 1.
8. A display comprising:
the light emitting device according to claim 1.

* * * * *